United States Patent
Karg et al.

(10) Patent No.: US 7,306,970 B2
(45) Date of Patent: Dec. 11, 2007

(54) METHOD AND APPARATUS FOR MANUFACTURING AN OPTOELECTRONIC DEVICE

(75) Inventors: Siegfried F. Karg, Adliswil (CH); Bruno Michel, Adliswil (CH); Heike E. Riel, Rueschlikon (CH); Walter H. Riess, Thalwil (CH)

(73) Assignee: International Business Machines Corporation, Armonk, NY (US)

( * ) Notice: Subject to any disclaimer, the term of this patent is extended or adjusted under 35 U.S.C. 154(b) by 206 days.

(21) Appl. No.: 11/214,334

(22) Filed: Aug. 29, 2005

(65) Prior Publication Data

US 2006/0046342 A1  Mar. 2, 2006

(30) Foreign Application Priority Data

Aug. 30, 2004 (EP) .................................. 04405538

(51) Int. Cl.
*H01L 51/40* (2006.01)

(52) U.S. Cl. .................. 438/99; 438/455; 156/349

(58) Field of Classification Search .................. 438/30, 438/99, 455, 458, FOR. 135, 570, 572; 257/E51.003, 257/E51.018, E51.022, E51.024, E51.026; 156/349, 570

See application file for complete search history.

(56) References Cited

U.S. PATENT DOCUMENTS

2004/0245923 A1* 12/2004 Park et al. .................. 313/505
2006/0027117 A1*  2/2006 Cavallini et al. ........... 101/486

* cited by examiner

*Primary Examiner*—Brook Kebede
(74) *Attorney, Agent, or Firm*—Lynn L. Augspurger

(57) ABSTRACT

A method for manufacturing an organic electronic device including a stack of layers with a lateral structure on a substrate, at least one of the layers being an organic material layer. A method includes with the step of providing a stamp with at least one protrusion of the surface area corresponding to the lateral structure. The stack of layers is deposited with a first face on the surface area of the protrusion of the stamp. A second face of the stack that is opposite to the first face is brought into adhesive contact with the substrate. The stamp is released from the stack.

19 Claims, 2 Drawing Sheets

METHOD AND APPARATUS FOR MANUFACTURING AN OPTOELECTRONIC DEVICE

FIELD OF THE INVENTION

The present invention relates to an organic electronic device comprising a stack of organic layers and a method for manufacturing an organic electronic device. In particular, the organic electronic device is an organic light emitting device (OLED) or another organic optoelectronic device.

BACKGROUND OF THE INVENTION

Organic electronic devices usually comprise laterally structured or patterned active layers. One example for such an electronic device is a full-colour display device comprising a number of pixels, each pixel being subdivided into three colour sub-pixels comprising different organic layers and generating either red or green or blue light each.

Since photolithographic methods used in the production of other electronic devices are generally not applicable to organic layers, a widely used method for patterning an organic layer is the use of a shadow mask. For each colour, a respective OLED stack of organic material layers is vacuum-deposited through a dedicated shadow mask. Problems of this technique are the resolution and size of the shadow mask as well as its thermal expansion and a relatively long processing time resulting from the method. Therefore, the shadow mask method is considered as being not applicable for mass production of large-scale organic electroluminescence displays.

Means of improving the accuracy of patterns and overlay are self-alignment which are discussed in U.S. Pat. No. 5,817,242 (Biebuyck et al., "Stamp for a lithographic process") and in U.S. Pat. No. 2001/0013294 (B. Michel et al., "Stamp device for printing a pattern on a surface of a substrate"). Means of improving the pattern stability against collapse under load are discussed in the papers: "Siloxane Polymers for High-Resolution, High-Accuracy Soft Lithography" (H. Schmid and B. Michel, Macromolecules 33, 3042-3049 (2000)), "Printing Meets Lithography: Soft Approaches to High-Resolution Patterning" (B. Michel et al., IBM J. Res. Develop. 45(5), 697-720 (2001)) and "Conformal contact and pattern stability of stamps used for soft lithography" (A. Bietsch and B. Michel, J. Appl. Phys. 88(7), 4310 (2000)).

SUMMARY OF THE INVENTION

According to a first aspect, the present invention provides a fast and less expensive method of manufacturing an organic electronic device is provided. An example method for manufacturing an organic electronic device includes: providing a stack of layers with a lateral structure on a substrate, at least one of the layers being an organic material layer; providing a stamp with at least one protrusion with a surface area corresponding to the lateral structure; depositing the stack of layers with a first face on the surface area of the protrusion of the stamp; bringing a second face of the stack that is opposite to the first face into adhesive contact with the substrate; and releasing the stamp from the stack.

According to another aspect, the present invention provides an organic electronic device comprising a substrate and a stack of layers with a lateral structure on the substrate. The stack includes at least one organic material layer, wherein the thickness of the organic layers of the stack is essentially laterally homogeneous.

The present invention provides a number of advantages. The present invention provides lateral homogeneous layer thickness which constitutes a significant difference from the products manufactured with conventional methods. The use of a conventional shadow mask results in layer thicknesses which continuously decrease at the edges of the stacks deposited on the substrate. Several drawbacks result from these inhomogeneous layer thicknesses which are overcome by the present invention.

BRIEF DESCRIPTION OF THE DRAWINGS

These and other objects and features of the present invention will become clear from the following description taken in conjunction with the accompanying drawings, in which.

DESCRIPTION OF THE INVENTION

Figure 1:
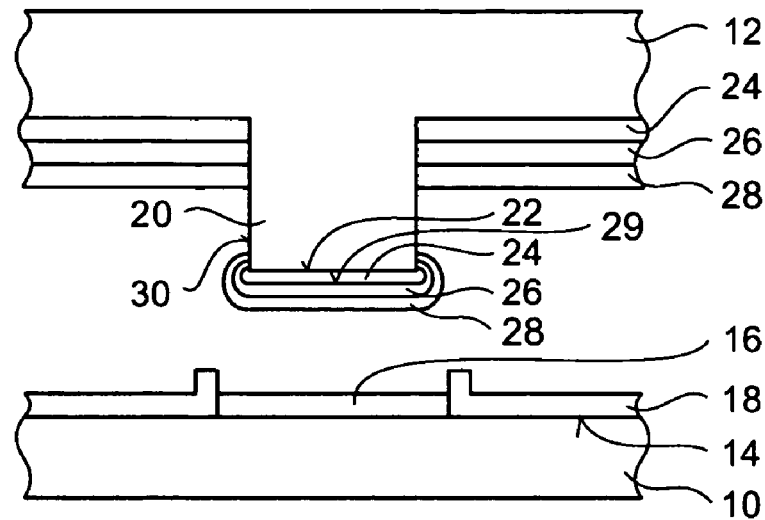
FIGS. 1 to 3 are schematic cross-sections of an organic electronic device according to an advantageous embodiment of the present invention in three different stages of a method for manufacturing according to the present invention.

The present invention provides a faster and cheaper method of manufacturing an organic electronic device. In an example embodiment, a method for manufacturing an organic electronic device includes: providing a stack of layers with a lateral structure on a substrate, at least one of the layers being an organic material layer; providing a stamp with at least one protrusion with a surface area corresponding to the lateral structure; depositing the stack of layers with a first face on the surface area of the protrusion of the stamp; bringing a second face of the stack that is opposite to the first face into adhesive contact with the substrate; and releasing the stamp from the stack.

Further, the present invention provides an organic electronic device comprising a substrate and a stack of layers with a lateral structure on the substrate. A stack includes at least one organic material layer, wherein the thicknesses of the organic layers of the stack are essentially laterally homogeneous.

The present invention is based on the idea to deposit a stack of layers for an organic electronic device on a stamp and to transfer the complete stack at once to a substrate wherein the lateral structure of one or more protrusions of the stamp defines the lateral structure of the organic layer stack. In contrast to the above-mentioned shadow mask method, the present invention provides organic layers with essentially laterally homogeneous thickness. The edges of the laterally structured stack are edges of break, which are produced when the stamp is removed from the substrate. In the step of removing the stamp, those areas of the stack corresponding to the areas defined by the protrusions and therefore in contact with the surface of the substrate remain on the substrate. Other areas of the stack which had been deposited in recesses between the protrusions and therefore not getting in contact with the surface of the substrate remain on the stamp.

In an advantageous embodiment a release layer, for example Ca, LiF, fluorocarbon polymers, cyclododecane and other waxes, and, particularly, combinations of these materials. In particular, cyclododecane is a very advantageous release layer material as it easily sublimes when heat is applied. Preferably, this heat is applied in the form of a short heat pulse preferably dissipated by a laser through the transparent stamp.

The present invention provides a number of advantages. The present invention provides lateral homogeneous layer thickness which constitutes a significant difference from the products manufactured with conventional methods. The use of a conventional shadow mask results in layer thicknesses which continuously decrease at the edges of the stacks deposited on the substrate. Several drawbacks result from these inhomogeneous layer thicknesses which are overcome by the present invention.

In particular, in the organic electronic device according to the present invention the electrical field across the stack of layers is more constant. Therefore, the risk of an electrical breakdown is considerably reduced and in the case of an optoelectronic organic device the brightness of the light emitted is more constant from the centre to the edges of each stack.

Furthermore, a higher resolution and a higher dimensional stability are provided since the edges of the stack are better defined edges of break rather than blurred shadow images of a mask, and since there is no thermal expansion problem. Furthermore, the method provides a shorter processing time and is more easily scalable to large areas thereby facilitating the manufacture of larger devices at lower cost.

FIG. 1 is a schematic view of a cross-section of a substrate 10 and a stamp 12 which are arranged substantially parallel and opposed to each other. In this stage, the substrate 10 and the stamp 12 are laterally aligned with each other and vertically spaced apart from each other.

A surface 14 of the substrate 10 faces the stamp 12. On the surface 14, a first element 16 and a second element 18 are provided which have been deposited in an earlier stage of manufacturing. The lateral extension of the first element 16 at least approximately defines the place where a stack of organic layers is to be deposited. In this embodiment, preferably, the stack of organic layers comprises at least one electroluminescent organic material layer and the first element 16 is an electrode, in particular an anode. The device to be manufactured is, for example, a display device wherein film transistors or other controlling circuits are provided at or under the surface 14 of the substrate 10 controlling the application of a voltage to the anode 16.

The stamp 12 is made from a flexible material, for example PDMS (polydimethylsiloxane). Preferably the flexibility or Young's modulus of the stamp 12 is in the range of 1 to 10 MPa, for example 3 MPa such that it is suited for the application of a pressure of 0.01 to 1 MPa. The stamp 12 comprises a protrusion 20 with a surface area 22 essentially corresponding to the lateral extension of the first element 16.

On the stamp 12 a release layer 24 and a stack of layers 26, 28 are deposited such that a first face 29 of the stack abuts to the release layer 24. The stack may comprise two or more layers 26, 28, at least one of which is an organic material layer. If the device to be manufactured is an OLED (OLED=organic light emitting device) one layer contains for example Alq3 and a second layer contains an aromatic diamine derivative e.g. NPB for a green pixel. According to another example of an OLED the stack contains a polymer layer as an active layer which is sprayed or otherwise deposited.

The release layer 24 and the layers 26, 28 are deposited on the surface area 22 and on the other surfaces of the stamp 12 which are here substantially parallel to the surface area 22. In the example shown in the FIGS. 1 to 3, the release layer 24 and the layers 26, 28 have been deposited by an anisotropic deposition method. Therefore, the thickness of the release layer 24 and of the layers 26, 28, and in particular the thickness of the at least one organic material layer is essentially laterally homogeneous on the surface area 22 and on other surfaces of the stamp 12 which are here substantially parallel to the surface area 22. On surfaces 30 of the protrusion 20 which are substantially perpendicular to the surface area 22, the release layer 24 and the layers 26, 28 are essentially not present due to the directionality of the deposition method. Only near the convex edges of the protrusion 20 there may be deposited some material of the layers 24, 26, 28 as it is shown in FIG. 1.

If the release layer 24 and the layers 26, 28 are deposited anisotropically the release layer 24 and the layers 26, 28 are parallelepipeds on the surface area 22 and do not exist on the perpendicular surfaces 30. As a further alternative, one or more of the release layer 24 and the layers 26, 28 are deposited isotropically and others are deposited anisotropically. As will become apparent from the subsequent description of the invention, the inventive concept is advantageous for all these alternatives.

Figure 2:
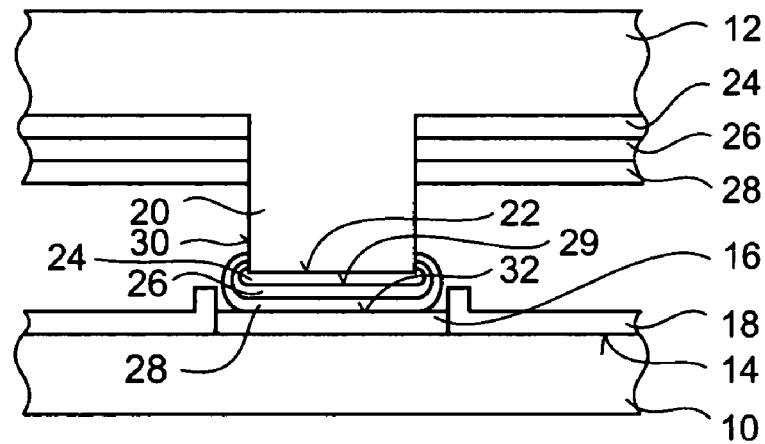
Figure 3:
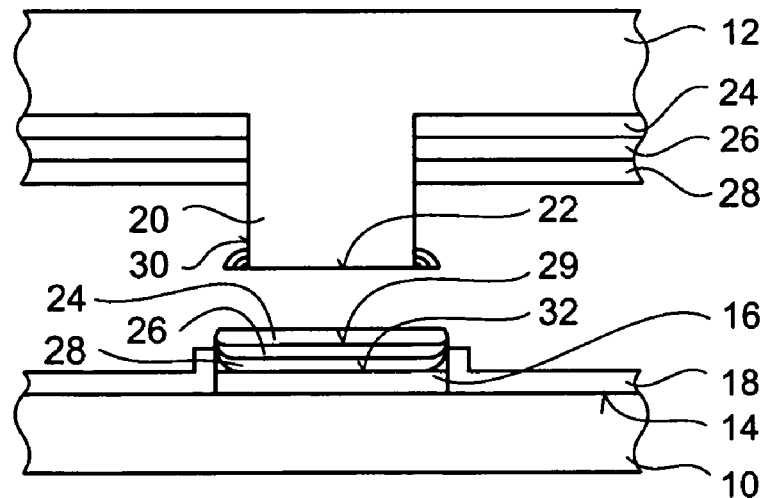

In order to improve the understanding of the invention, it is noted that the geometrical proportions of real devices can and will generally deviate considerably from those shown in the FIGS. 1 to 3. In particular, the typical thickness of a layer is in the range of 100 nm and the typical vertical dimension of the protrusion 20 is in the range of 1-50 µm, whereas the lateral dimension of the protrusion 20 is typically in the range of 20 µm to 500 µm.

FIG. 2 shows the same cross-section of the substrate 10 and the stamp 12 as in FIG. 1 in a next stage of the method. The stamp 12 is pressed against the substrate 10 with a pressure in the range of 0.01 MPa to 1 MPa, preferably 0.1 MPa. Those parts of the release layer 24 and the layers 26, 28 deposited over the surface area 22 on the protrusion 20 are pressed onto the first element 16 whereby a second face 32 of the stack formed by the layers 26, 28 gets into conformal contact with the first element 16 and thenceforward adheres to it. Other parts of the stack of layers 26, 28 are not in contact with the substrate 10 or one of the elements 16, 18.

After bringing the second face 32 of the stack into adhesive contact with the substrate 10 or the first element 16 on the substrate 10 as shown in FIG. 2, the stamp 12 is released from the substrate 10.

The resultant situation is shown in FIG. 3 which again shows a schematic cross-section of the substrate 10 and the stamp 12. The material of the release layer 24 is selected such that the adhesive force between the release layer 24 and the surface area 22 of the protrusion 20 is weaker than the adhesive force between the second face 32 of the layer 28 and the first element 16 and between the layers 26, 28. Therefore, those parts of the release layer 24 and the layers 26, 28 which have been deposited over the surface area 22 of the protrusion 20 remain on the first element 16. Other parts of the release layer 24 and the layers 26, 28 remain on the stamp 12. If the release layer 24 and the layers 26, 28 have been deposited at least partly on the perpendicular surface 20 they break off near the edges of the protrusion 20 or the surface area 22, respectively. Thus the edge of the stack of layers 26, 28 deposited on the surface area 22 is a broken edge, i.e. an edge of break.

As a result, there is a laterally structured stack of layers 26, 28 on the first element 16, as shown in FIG. 3. Bearing the above-mentioned actual proportions of vertical and horizontal dimensions in mind, it is clear that the thicknesses of the stack layers 26, 28 and of the release layer 24 are substantially laterally homogeneous. Deviations from the lateral homogeneity are restricted to only appear within a distance in the order of substantially the layer thickness from the outer edges of the stack of layers 26, 28 remaining on the substrate 10. In this context, it is noted again that the thicknesses shown in the Figures are strongly exaggerated in relation to the horizontal dimensions when compared to a real device.

As an alternative to the method described above with regard to FIGS. 1 to 3, the release layer 24 may be provided in a form that partly or completely remains on the surface area 22 of the stamp 12 when the stamp 12 is released from the stack of layers 26, 28. Furthermore, the release layer 24 may comprise two or more sub-layers. Advantageous materials comprised in the release layer are fluorocarbonpolymers such as PTFE ("Teflon"), Ca, LiF, Al, Mg, lithium benzoate, lithium acetate, an alkali metal, an earthalkali metal, a transition metal, an oxide, benzoate or acetonate of an alkali, earthalkali or transition metal, cyclododecane or another wax. A fluorocarbonpolymer layer is preferably deposited by evaporation in vacuum. Although in this way typically no PTFE or at least no pure PTFE is deposited, such a fluorocarbonpolymer layer provides similar properties, in particular low adhesion to other layers.

A sufficiently low adhesion to other layers is also provided by a LiF layer or a Ca or CaO layer. An electrically conductive metal release layer 24 which remains on the stack of layers 26, 28, advantageously forms at least a part or a component of an electrode which will be formed on the first face 29 of the stack of layers 26, 28 which is opposite to the first element 16 in order to enable application of a voltage to the stack of layers 26, 28.

In an advantageous embodiment the release layer 24 can exhibit the property to be changeable in its state to either keep the stack attached to the stamp 12 or to release the stack to remain attached to the substrate 10. Cyclododecane has the advantageous property to sublime under normal pressure at moderate temperatures slightly above room temperature or under reduced pressure already at room temperature. Preferably, hence, heat or vacuum or a combination of heat and vacuum can be used to effectuate the state change and hence the adhesion change of the stack. A cyclododecane release layer 24 is therefore easily released by a short heat pulse. A short heat pulse is preferably applied to the release layer 24 by a laser beam which is scanned across the backside of the stamp 12 and passed through the transparent material of the stamp 12 to the surface area 22 and the release layer 24. Preferably, the moment of the heat pulse from the laser beam is synchronous to the local moment of release of the surface area 22 from the stack of layers 26, 28. The heat pulse is preferably dimensioned such that substantially no macroscopic heating of the stamp 12 results.

Other materials subliming at or near room temperature are useful as release layer materials as well. Preferably, a material is used which is in the solid phase at room temperature and normal pressure and sublimes at normal pressure and moderate temperatures. At moderate temperatures the materials of the organic electronic device are not destroyed and their electronic or optoelectronic and mechanical properties do not deteriorate. Therefore, depending on the materials comprised in the device, the sublimation temperature is preferably at or below about 40° C., 60° C., 80° C. or 100° C. at normal pressure or at a reduced pressure.

Although each of the above-mentioned release layer materials by itself provides beneficial properties, a combination of two or more of these materials in different sub-layers further improves and facilitates the release. For example, a fluorocarbonpolymer layer on the surface area 22 of the protrusion 20, a cyclododecane layer and a Ca layer adjacent to the stack of layers 26, 28 provide most advantageous release properties. The cyclododecane layer sublimes during or after the release, the fluorocarbon polymer remains on the stamp 12 and the Ca layer remains on the stack of layers 26, 28. In a next step one or more additional conductive layers are deposited over the Ca layer by evaporation through a shadow mask or by means of an additional stamp, thereby completing an electrode. If the at least one organic layer of the stack of layers 26, 28 comprises an electroluminescent material, emission of light is caused by an application of a voltage between this electrode and the first element 16.

As already mentioned above, an important application of this invention is the manufacturing of an OLED full colour display device. For this purpose, for a single pixel, three sets of stacks, one per color, each comprising at least one organic material layer are deposited on the substrate 10 using the described method. Voltages can be applied independently to each of the stacks by means of control circuits at or below the surface 14 of the substrate 10. At each pixel, at least one stack of each primary colour (red, green, blue) is provided.

Figure 4:
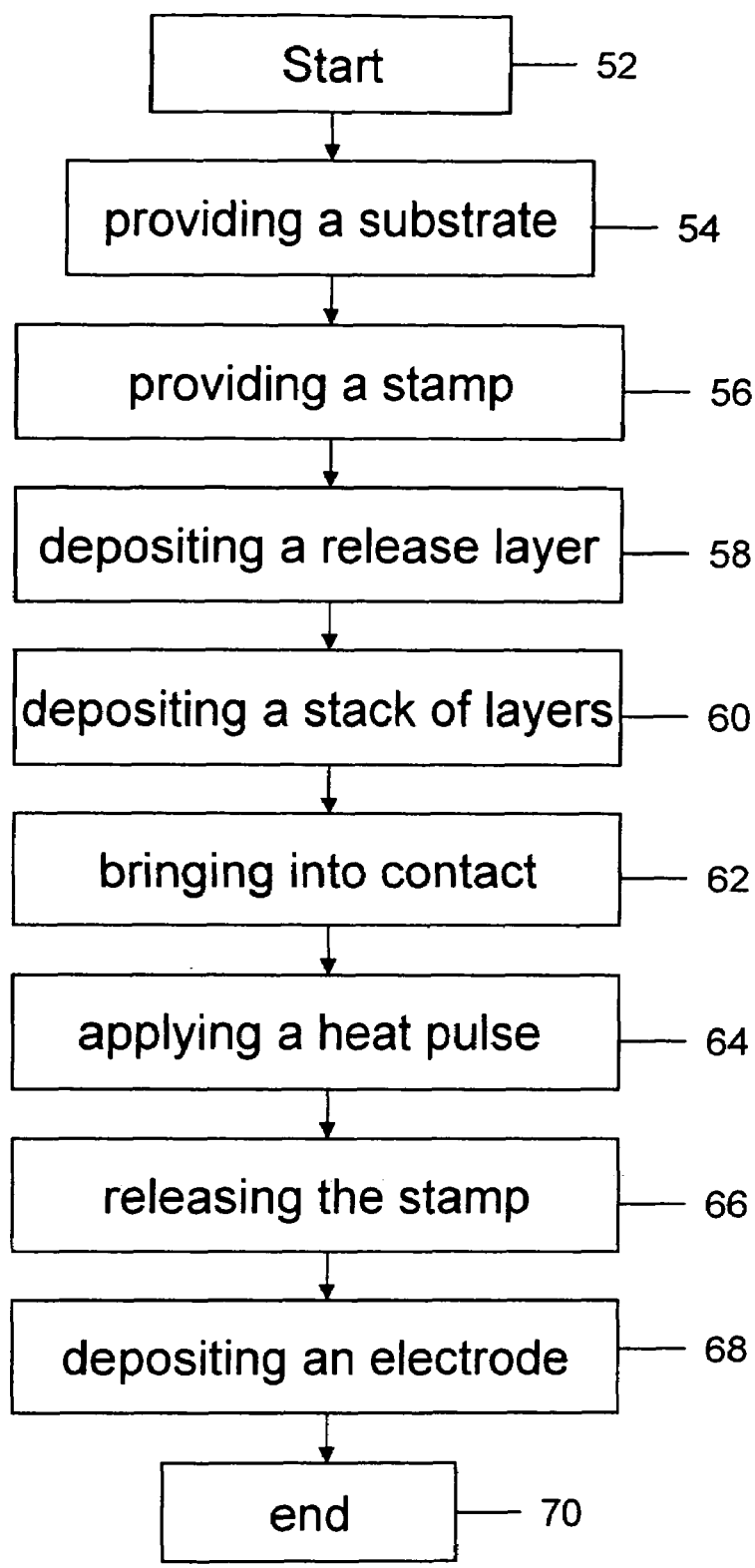
FIG. 4 is a schematic flow chart of an advantageous embodiment of the method according to the present invention.

FIG. 4 is a schematic flow chart representing an advantageous embodiment of the method according to the invention. After the start of the method (first step 52), a substrate 10 and a stamp 12 are provided (second step 54 and third step 56). As already described above with reference to FIGS. 1 to 3, the substrate 10 provides a surface 14 with first elements 16 on which one or more stacks of layers 26, 28 with a lateral structure corresponding to the lateral structure of the first elements 16 are to be deposited in the subsequent steps.

Alternatively, no first element 16 is provided on the substrate 10, or the surface 14 of the substrate 10 is completely unstructured. In this case no lateral alignment is necessary and the stack of layers 26, 28 deposited in subsequent steps preferably comprises additional features, for example a bottom electrode to be placed on the substrate 10.

In a fourth step 58, a release layer 24 is deposited on the stamp 12. In a fifth step 60, a stack of layers 26, 28 is deposited on the release layer 24. This stack of layers 26, 28 may comprise any number of individual layers and comprises at least one organic material layer. Thereby, a first face 29 of the stack is in contact with the release layer 24. A second face 32 is opposite to the first face 29.

In a sixth step 62, the second face 32 of the stack is brought into adhesive contact with the substrate 10. In a seventh step 64, heat, preferably in form of a heat pulse, is applied to the release layer 24 and simultaneously or immediately after the application of the heat, the stamp 12 is released from the stack in an eighth step 66. Alternatively, the application of the heat pulse in step 64 can be skipped if the adhesion of the stack to the release layer 24 or the adhesion of the stack with the release layer 24 to the stamp 20 is weaker than the adhesion of the stack to the substrate 10 or if the release layer 24 can be removed by vacuum. Furthermore, both, heat and vacuum may be applied together advantageously.

In a ninth step 68, an electrode is deposited over the deposited stack on the substrate 10. If the release layer 24 at least partly remains on the stack and comprises an electrically conductive material it forms an electrically conductive layer. This conductive layer may form an electrode or a part of an electrode. In this case the ninth step 68 preferably consists of depositing an additional conductive layer which reinforces the conductive layer and reduces the electrical resistance. If no reinforcement is necessary or if the stack of layers 26, 28 comprises a complete electrode layer or if no electrode is provided the ninth step 68 can be skipped.

Other steps may follow in order to complete the electronic device before the method for manufacturing ends in a tenth step 70. Depending on the electronic device to be manufactured, the third step 56 through the eighth step 66 may be repeated on the same substrate 10 with different stamps 12 in order to deposit different stacks at different places on the substrate 10.

Further, the method may be repeated with the same stamp on different substrates in order to manufacture a plurality of electronic devices. In this case, preferably the stamp 12 is cleaned, for example by applying a solvent or an oxygen- and/or fluor-plasma in order to remove those parts of the layers 26, 28 which have not been transferred to the substrate 10. Preferably, the release layer 24 or sub-layers of the release layer 24 are removed as well.

In order to facilitate the transfer and in particular the release, further measures may be taken, as for example swelling of the stamp 12 before printing, treating the first element 16 to render it more affine to the layer 28, reducing the amount of mobile silicon on the stamp by using purified pre-polymers or solvent purification of the finished stamp. Furthermore, the transfer efficiency is improved by a controlled transfer temperature and by a controlled separation speed during removal of the stamp 12.

Preferably, the temperature of the stamp 12 is held substantially constant at a defined temperature level, thereby reducing thermal expansion and resulting drawbacks and improving the lateral accuracy of the method.

Further, a supporting backplane of the stamp 12 is preferably chosen with the same or a closely similar thermal expansion coefficient as the substrate 10 on which the stack of layers 26, 28 is printed, thereby providing a higher accuracy of the transfer process.

Variations described for the present invention can be realized in any combination desirable for each particular application.

Thus particular limitations, and/or embodiment enhancements described herein, which may have particular advantages to the particular application need not be used for all applications. Also, not all limitations need be implemented in methods, systems and/or apparatus including one or more concepts of the present invention. The invention also includes apparatus for implementing steps of a method of this invention, and methods implementing functions of an apparatus of this invention.

It is noted that the foregoing has outlined some of the more pertinent objects and embodiments of the present invention. This invention may be used for many applications. Thus, although the description is made for particular arrangements and methods, the intent and concept of the invention is suitable and applicable to other arrangements and applications. It will be clear to those skilled in the art that modifications to the disclosed embodiments can be effected without departing from the spirit and scope of the invention. The described embodiments ought to be construed to be merely illustrative of some of the more prominent features and applications of the invention. Other beneficial results can be realized by applying the disclosed invention in a different manner or modifying the invention in ways known to those familiar with the art.

What is claimed is:

1. A method for manufacturing an organic electronic device comprising the steps of:
   providing a stack of layers with a lateral structure on a substrate, at least one of the layers being an organic material layer;
   providing a stamp with at least one protrusion with a surface corresponding to the lateral structure;
   depositing the stack of layers with a first face on the surface area of the protrusion of the stamp;
   bringing a second face of the stack that is opposite to the first face into adhesive contact with the substrate; and
   releasing the stamp from the stack.

2. The method according to claim 1, further comprising the step of depositing a release layer on the stamp before depositing the stack of layers.

3. The method according to claim 2, wherein in the step of releasing, the release layer remains at least partially on the stamp or on the stack.

4. The method according to claim 2, wherein in the step of releasing, the release layer remains on the stack and forms at least part of an electrode of the organic electronic device.

5. The method according to claim 2, wherein the release layer comprises one or more materials selected from the group of Ca, LiF, Al, Mg, lithium benzoate, lithium acetonate, a fluorocarbonpolymer, an alkali metal, an earthalkali metal, a transition metal, an alkali metal fluoride, an earthalkali metal fluoride, a transition metal fluoride, an alkali metal oxide, an earthalkali metal oxide, a transition metal oxide, an alkali metal benzoate or acetonate, an earthalkali metal benzoate or acetonate, a transition metal benzoate or acetonate, cyclododecane, a wax, a material which is solid at room temperature and sublimes at a temperature below about 100° C.

6. The method according to claim 2, wherein the step of releasing comprises applying heat or vacuum to the release layer.

7. The method according to claim 2, wherein in the step of releasing the release layer at least partly sublimes.

8. The method according to claim 1, wherein the second face is a surface of a conducting layer forming at least part of an electrode layer of the organic electronic device.

9. The method according to claim 1, wherein after the step of releasing, an electrically conductive layer is deposited on the first face of the stack.

10. The method according to claim 1, wherein the organic electronic device is an organic light emitting device or another optoelectronic device.

11. An apparatus to manufacture an organic electronic device comprising:
    means for providing a stack of layers with a lateral structure on a substrate, at least one of the layers being an organic material layer:
    means for providing a stamp with at least one protrusion with a surface corresponding to the lateral structure;
    means for depositing the stack of layers with a first face on the surface area of the protrusion of the stamp;
    means for bringing a second face of the stack that is opposite to the first face into adhesive contact with the substrate; and
    means for releasing the stamp from the stack.

12. An apparatus according to claim 11, further comprising means for depositing a release layer on the stamp before depositing the stack of layers.

13. An apparatus according to claim 12, wherein in the means for releasing, the release layer remains at least partially on the stamp or on the stack.

14. An apparatus according to claim 12, wherein in the means for releasing, the release layer remains on the stack and forms at least part of an electrode of the organic electronic device.

15. A method for manufacturing an organic electronic device comprising the steps of:
   providing a stack of layers with a lateral structure on a substrate, at least one of the layers being an organic material layer:
   depositing the stack of layers for the organic electronic device on a stamp; and
   transferring the complete stack at once to a substrate, wherein a lateral structure of at least one protrusion of the stamp defines the lateral structure of the organic layer stack.

16. The method according to claim 15, further comprising the step of producing edges of the laterally structured stack being edges of break, when the stamp is removed from the substrate.

17. The method according to claim 15, wherein when removing the stamp, areas of the stack corresponding to areas defined by said at least one protrusion in contact with the surface of the substrate remain on the substrate, and wherein other areas of the stack deposited in recesses between said at least one protrusion not getting in contact with the surface of the substrate remain on the stamp.

18. The method according to claim 15, further comprising employing a release layer taken from a group of release layers consisting of: Ca, LiF, fluorocarbon polymers, cyclododecane, other waxes, and, any combination of these materials.

19. The method according to claim 15, further comprising employing a release layer of cyclododecane, and applying heat in the form of a short heat pulse dissipated by a laser through a transparent stamp.

\* \* \* \* \*